(12) United States Patent
Platt

(10) Patent No.: US 6,740,398 B2
(45) Date of Patent: May 25, 2004

(54) MAGNETIC FILMS INCLUDING IRIDIUM, MANGANESE AND NITROGEN

(75) Inventor: Christopher Loren Platt, Pittsburgh, PA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 10/008,646

(22) Filed: Nov. 9, 2001

(65) Prior Publication Data

US 2002/0098380 A1 Jul. 25, 2002

Related U.S. Application Data

(60) Provisional application No. 60/263,733, filed on Jan. 24, 2001.

(51) Int. Cl.⁷ .................................................. G11B 5/65
(52) U.S. Cl. .................. 428/332; 428/692; 428/694 TS
(58) Field of Search ............................. 428/611, 668, 428/332, 692, 694 TS, 900; 360/324.11

(56) References Cited

U.S. PATENT DOCUMENTS

| | | | |
|---|---|---|---|
| 5,552,949 A | 9/1996 | Hashimoto et al. | |
| 5,739,987 A | 4/1998 | Yuan et al. | |
| 5,748,413 A | 5/1998 | Lederman et al. | |
| 5,764,056 A | 6/1998 | Mao et al. | |
| 5,764,445 A | 6/1998 | Torng et al. | |
| 5,768,067 A | 6/1998 | Saito et al. | |
| 5,780,176 A | 7/1998 | Iwasaki et al. | |
| 5,784,225 A | 7/1998 | Saito et al. | |
| 5,862,022 A | 1/1999 | Noguchi et al. | |
| 5,919,580 A * | 7/1999 | Barnard et al. | 428/692 |
| 5,942,342 A * | 8/1999 | Hikosaka et al. | 428/694 R |
| 6,057,049 A | 5/2000 | Fuke et al. | |
| 6,166,891 A | 12/2000 | Lederman et al. | |
| 6,278,592 B1 * | 8/2001 | Xue et al. | 360/324.12 |
| 2002/0181170 A1 * | 12/2002 | Lin et al. | 360/324.11 |

OTHER PUBLICATIONS

Anderson, G., Huai, Y., and Pakala, M., J., App. Phys., 87(9), 2000, 5726–5728.*
Fuke, H., Saito, K., Yoshikawa, M., Iwasaki, H., and Sahashi, M. App. Phys. Let., 75(23), 1999, 3680–3682.*
Tanaka, A., Shimizu, Y., Kishi, H., Nagaska, K., Kanai, H., and M. Oshikik IEEE Trans. Mag., 35(2), 1999, 700–705.*

* cited by examiner

Primary Examiner—Paul Thibodeau
Assistant Examiner—Kevin M. Bernatz
(74) Attorney, Agent, or Firm—Allen G. Towner, Esq.; Pietragallo, Bosick & Gordon

(57) ABSTRACT

Magnetic films comprising iridium, manganese and nitrogen (IrMnN) are disclosed. Multi-layer structures including ferromagnetic layers deposited on the IrMnN films are also disclosed. The IrMnN films have a (200) texture and may act as seed layers and/or exchange biasing layers for the ferromagnetic layers deposited thereon. The multi-layer structures are useful in applications such as read sensors for magnetic recording heads and soft magnetic underlayers for perpendicular magnetic recording media.

22 Claims, 5 Drawing Sheets

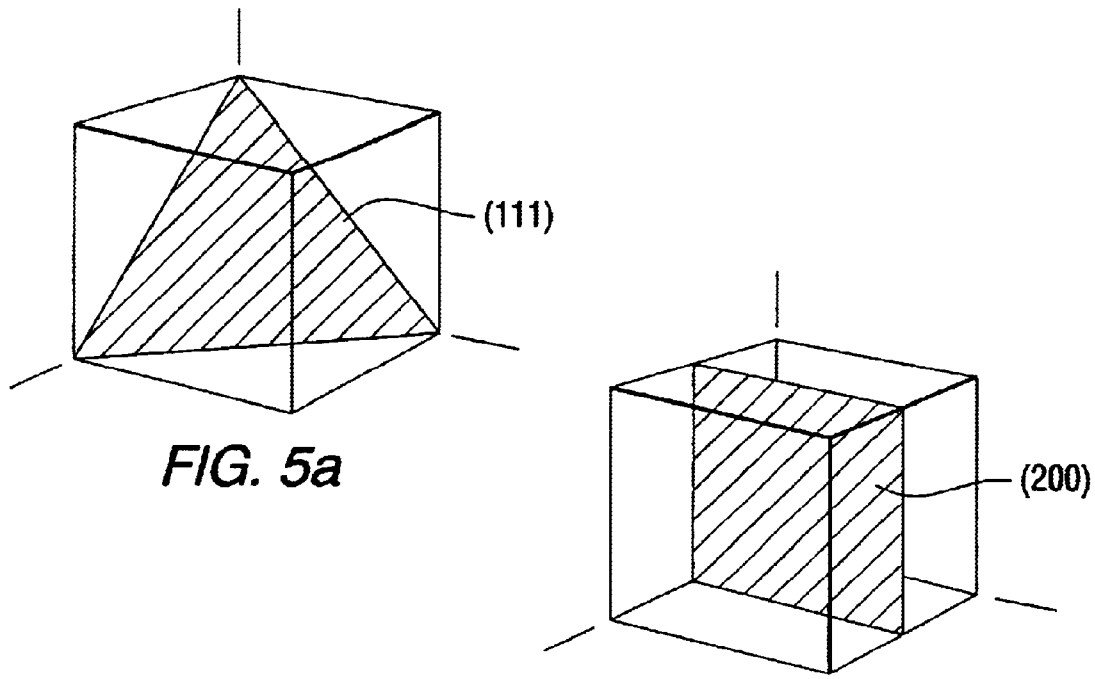
FIG. 5a
FIG. 5b
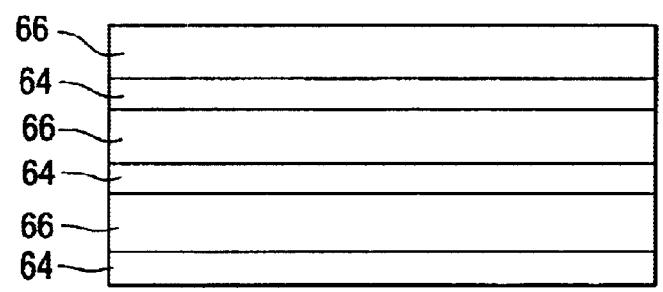
FIG. 6
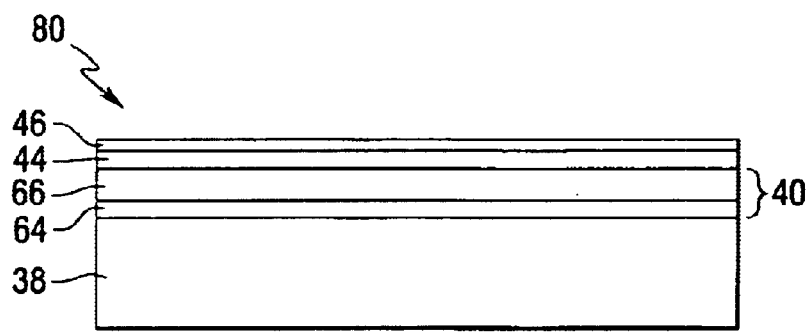
FIG. 7

MAGNETIC FILMS INCLUDING IRIDIUM, MANGANESE AND NITROGEN

CROSS REFERENCE TO RELATED APPLICATIONS

This application claims the benefit of U.S. Provisional Application Serial No. 60/263,733 filed Jan. 24, 2001 now abandoned.

FIELD OF THE INVENTION

The present invention relates to multi-layer magnetic films, and more particularly relates to a ferromagnetic film deposited on a film comprising iridium, manganese and nitrogen (IrMnN). The IrMnN film may act as a seed layer and/or exchange biasing layer for the ferromagnetic film. The films are useful in applications such as read sensors for magnetic recording heads and soft magnetic underlayers for perpendicular magnetic recording media.

BACKGROUND INFORMATION

Magnetic films are used in magnetic sensors, such as magnetoresistance (MR) and giant magnetoresistance sensors (GMR). For example, devices utilizing GMR effects have utility as read heads used in magnetic disc storage systems. GMR sensors typically comprise a stack of thin sheets of a ferromagnetic alloy, such as NiFe (Permalloy), magnetized along an axis of low coercivity. The sheets are usually mounted in the head so that their magnetic axes are transverse to the direction of disc rotation and parallel to the plane of the disc. The magnetic flux from the disc causes rotation of the magnetization vector in at least one of the sheets, which in turn causes a change in resistivity of the stack. In operation, a sense current is passed through a GMR stack. The presence of magnetic field in the storage media adjacent to the sensor changes the resistance of a GMR stack. A resulting change in voltage drop across the GMR stack due to the change of the resistance of the GMR stack can be measured and used to recover magnetically stored information.

Magnetic sensors utilizing the GMR effect are frequently referred to as spin valve sensors. A spin valve sensor is typically a sandwiched structure including two ferromagnetic layers separated by a thin non-ferromagnetic layer. One of the ferromagnetic layers is called the pinned layer because it is magnetically pinned or oriented in a fixed and unchanging direction. A common method of maintaining the magnetic orientation of the pinned layer is through antiferromagnetic exchange coupling utilizing an adjacent or nearby antiferromagnetic layer, commonly referred to as the pinning layer. The other ferromagnetic layer is called the free or unpinned layer because its magnetization can rotate in response to the presence of external magnetic fields.

The output voltage is affected by various characteristics of the sensor. The sense current can flow through the stack in a direction that is perpendicular to the planes of the stack strips, i.e., current-perpendicular-to-plane or CPP, or the sense current can flow through the stack in a direction that is parallel to the planes of the stack strips, i.e. current-in-plane or CIP. The CPP operating mode can result in higher output voltage than the CIP operating mode. Higher output voltages permit greater precision and sensitivity of the read sensor in sensing magnetic fields from the magnetic medium.

The benefits of spin valve sensors result from a large difference in electrical conductivity exhibited by the devices depending on the relative alignment between the magnetizations of the GMR element ferromagnetic layers. In order for antiferromagnetically pinned spin valve sensors to function effectively, a sufficient pinning field from the pinning layer is required to keep the magnetization of the pinned ferromagnetic layer unchanged during operation. Various antiferromagnetic materials, such as NiMn, FeMn, NiO, IrMn, PtPdMn, CrMnPt, RuRhMn and TbCo, have been used or proposed as antiferromagnetic pinning layers for spin valve sensors. For example, $Ir_{20}Mn_{80}$ films deposited by sputtering in an inert atmosphere exhibit an exchange coupling effect, but require an additional (111) textured ferromagnetic film, e.g. $Ni_{80}Fe_{20}$, as a seed layer below the deposited IrMn film in order to produce the effect.

In addition to their use in GMR sensors, multi-layer magnetic films may be used in perpendicular magnetic recording media. Conventional perpendicular recording media typically include a hard magnetic recording layer and a soft magnetic underlayer which provides a flux path from a trailing write pole to a leading opposing pole of the writer. To write to the magnetic recording media, the recording head is separated from the magnetic recording media by a distance known as the flying height. The magnetic recording media is moved past the recording head so that the recording head follows the tracks of the magnetic recording media. Current is passed through the coil to create magnetic flux within the write pole. The magnetic flux passes from the write pole tip, through the hard magnetic recording track, into the soft underlayer, and across to the opposing pole. The soft underlayer also helps during the read operation. During the read back process, the soft underlayer produces the image of magnetic charges in the magnetically hard layer, effectively increasing the magnetic flux coming from the medium. This provides a higher playback signal.

One of the challenges of implementing perpendicular recording is to resolve the problem of soft underlayer noise. The noise may be caused by fringing fields generated by magnetic domains, or uncompensated magnetic charges, in the soft underlayer that can be sensed by the reader. If the magnetic domain distribution of such materials is not carefully controlled, very large fringing fields can introduce substantial amounts of noise in the read element. Not only can the reader sense the steady state distribution of magnetization in the soft underlayer, but it can also affect the distribution of magnetization in the soft underlayer, thus generating time dependent noise. Both types of noise should be minimized.

In addition, the soft underlayer may form stripe domains, which generate noticeable noise and considerably reduce the signal-to-noise ratio of the recording medium. These stripe domains in the soft underlayer can be suppressed by applying an in-plane bias field. The bias field increases the effective anisotropy field of the soft underlayer and prevents domain formation that results in a permeability decrease. Techniques such as antiferromagnetic exchange biasing may be used to form the in-plane bias field. The antiferromagnetic exchange technique utilizes an antiferromagnetic film that is placed in direct contact with the ferromagnetic soft layer and forms antiferromagnetic exchange coupling between the layers. However, conventional antiferromagnetic materials have low corrosion resistance and require high temperature annealing to form exchange coupling. Furthermore, conventional antiferromagnetic materials have low blocking temperatures which limit their use in applications subject to elevated temperatures.

The present invention has been developed in view of the foregoing.

SUMMARY OF THE INVENTION

The present invention provides films comprising iridium, manganese and nitrogen (IrMnN). In accordance with an embodiment of the present invention, ferromagnetic thin films may be deposited on the antiferromagnetic IrMnN film. The IrMnN film may be made by reactively sputtering IrMn in a reactive nitrogen-containing atmosphere. The IrMnN film has a (200) growth texture. As used herein, the phrase "(200) texture" refers to the tendency for the film to grow with its crystals predominantly square with the film surface, e.g., the cube faces are either parallel or orthogonal to the film surface. For example, the (200) texture may comprise (100) crystallographic lattice planes of a face-centered cubic structure which lie parallel with the film surface. The IrMnN antiferromagnetic film differs from prior systems by providing an exchange coupling mechanism without requiring a (111) seed layer and/or a (111) orientation of the antiferromagnetic IrMn layer. The actual exchange bias effect and blocking temperature achieved by the IrMnN film are larger than for the pure IrMn film, making the present IrMnN antiferromagnetic films advantageous for use in perpendicular media as well as other applications.

An aspect of the present invention is to provide a film comprising IrMnN having a (200) texture.

Another aspect of the present invention is to provide a layered magnetic structure comprising an IrMnN layer, and a ferromagnetic layer deposited on the IrMnN layer.

A further aspect of the present invention is to provide a method of making an IrMnN film comprising depositing Ir and Mn on a substrate in the presence of a reactive nitrogen-containing atmosphere.

Another aspect of the present invention is to provide a method of making an IrMnN film comprising depositing the IrMnN film on a substrate, wherein the IrMnN film has a (200) texture.

A further aspect of the present invention is to provide a method of making a layered magnetic structure comprising providing an IrMnN layer, and depositing a ferromagnetic layer on the IrMnN layer.

These and other aspects of the present invention will be more apparent from the following description.

BRIEF DESCRIPTION OF THE DRAWINGS

FIGS. 5a and 5b are illustrations of (111) and (200) crystallographic planes of a cubic unit cell, respectively.

FIG. 6 is a partially schematic side sectional view of a laminated structure including multiple alternating layers of antiferromagnetic IrMAnN films and ferromagnetic films in accordance with an embodiment of the present invention.

FIG. 7 is a partially schematic side sectional view of a perpendicular magnetic recording medium including a soft magnetic underlayer comprising a ferromagnetic film deposited on an antiferromagnetic IrMnN film in accordance with an embodiment of the present invention.

DETAILED DESCRIPTION

Figure 1:
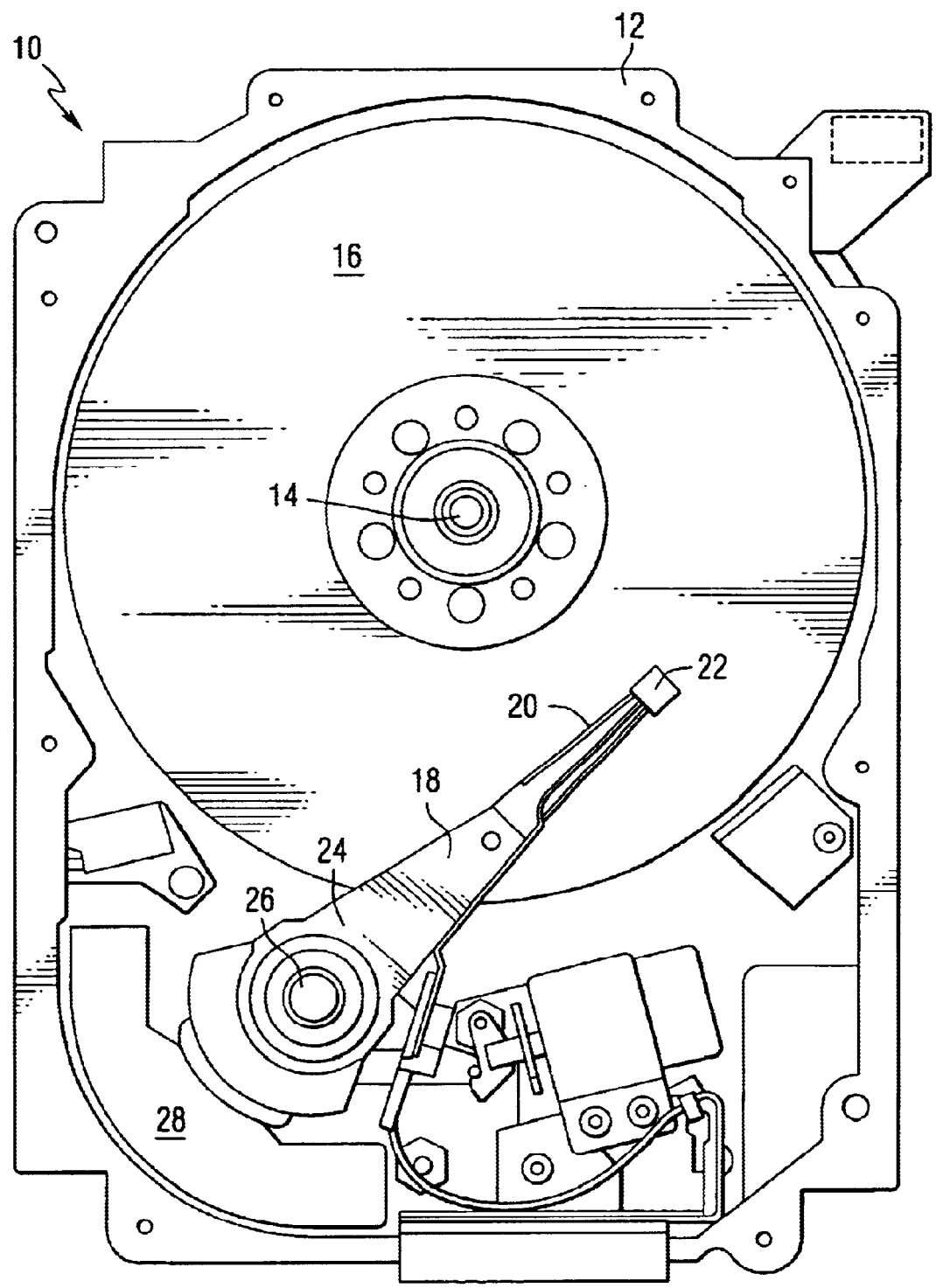
FIG. 1 is a pictorial representation of a disc drive that can use the perpendicular recording medium constructed in accordance with this invention.

FIG. 1 is a pictorial representation of a disc drive 10 that may include a multilayer magnetic film read sensor of the present invention. The disc drive 10 may also utilize a perpendicular recording medium with antiferromagnetic exchange coupling in a soft magnetic underlayer in accordance with this invention. The disc drive 10 includes a housing 12 (with the upper portion removed and the lower portion visible in this view) sized and configured to contain the various components of the disc drive. The disc drive 10 includes a spindle motor 14 for rotating at least one magnetic storage medium 16, which may be a perpendicular magnetic recording medium, within the housing, in this case a magnetic disc. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector of the disc 16. The actuator motor 28 is regulated by a controller, which is not shown in this view and is well known in the art.

Figure 2:
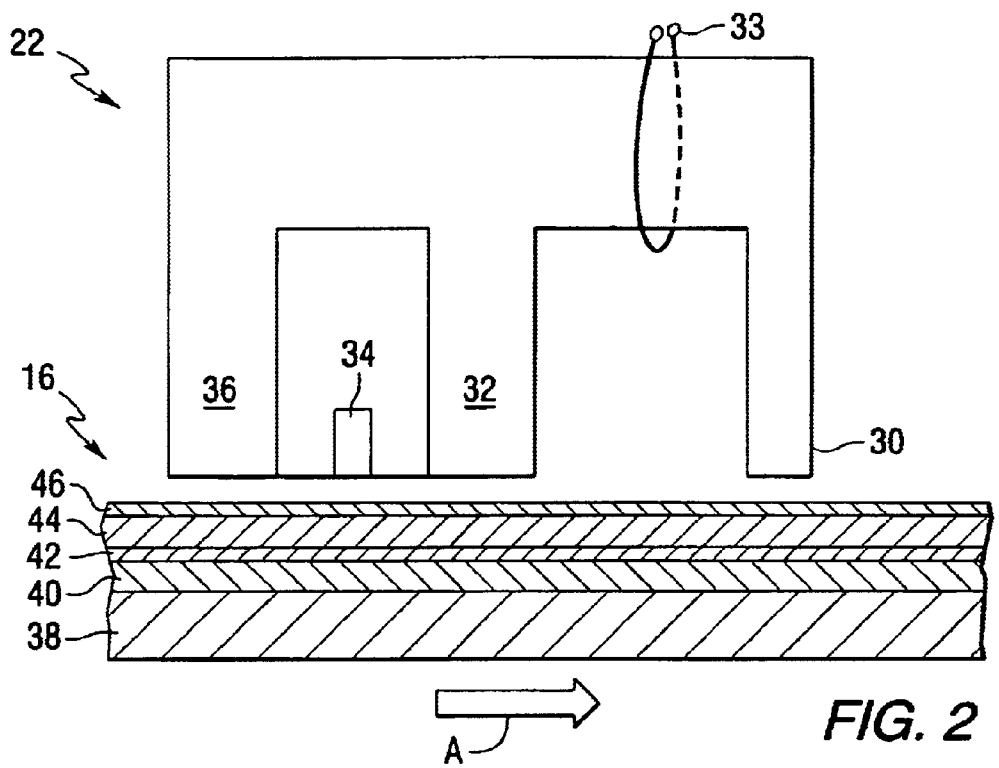
FIG. 2 is a partially schematic side view of a recording head and a recording medium which may include multilayer magnetic films in accordance with this invention.

FIG. 2 is a partially schematic side view of a perpendicular magnetic recording head 22 and a perpendicular recording magnetic medium 16. The recording head 22 is well known in the art and includes a writer section comprising a trailing main pole 30 and a return or opposing pole 32. A write coil 33 surrounds a yoke of the main pole 30. The recording head 22 also includes a reader section comprising a read element 34 positioned between a reader pole 36 and the opposing pole 32. Although a perpendicular recording head 22 is shown in FIG. 2, the read element 34 may be used in other types of recording heads, such as, longitudinal magnetic recording heads. The read element 34 may be a conventional GMR reader, MR reader, inductive reader, or the like. In the embodiment shown in FIG. 2, the reader section shares the opposing pole 32 of the writer section. In accordance with an embodiment of the present invention, the read element 34 may be a conventional spin valve in which the pinning layer is replaced with an IrMnN film.

Still referring to FIG. 2, the perpendicular magnetic recording medium 16 is positioned under the recording head 22. The recording medium 16 travels in the direction of arrow A during recording. The recording medium 16 includes a substrate 38, which may be made of any suitable material such as ceramic glass, amorphous glass, or NiP plated AlMg. A soft magnetic underlayer 40 is deposited on the substrate 38. The soft magnetic underlayer, in accordance with an embodiment of the present invention, is a multilayer soft magnetic film, which will be described in detail herein. A spacer layer 42 may be deposited on the soft magnetic underlayer 40. The spacer layer 42 may optionally be made of any suitable material such as at least one material selected from Cr, Ti, Ta, and $TiO_2$. The spacer layer 42 may have a thickness from about 5 to about 50 angstroms. A hard magnetic recording layer 44 is deposited on the spacer layer 42. Suitable hard magnetic materials for the hard magnetic recording layer 44 may include at least one material selected from CoCr, FePd, CoPd, CoFePd and CoCrPd. The hard magnetic layer 44 may have a thickness from about 2 nm to about 40 nm. A protective overcoat 46, such as a diamond-like carbon, may be applied over the hard magnetic recording layer 44.

Figure 3:
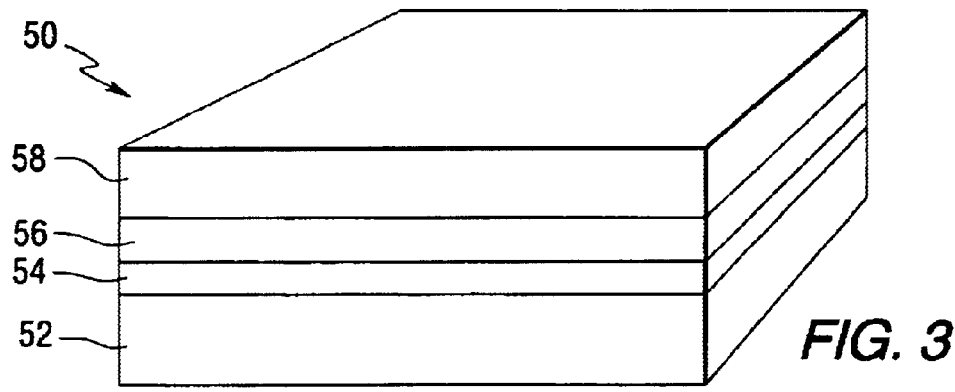
FIG. 3 is a partially schematic side sectional perspective view of a laminated structure including a substrate, seed layer, antiferromagnetic layer and ferromagnetic layer.

FIG. 3 schematically illustrates a multilayer structure 50 including a substrate 52, a seed layer 54, an antiferromagnetic layer 56 and a ferromagnetic layer 58. In order to achieve exchange couping between the antiferromagnetic layer 56 and the ferromagnetic layer 58, conventional multilayer structures have required the antiferromagnetic layer 56 to have a (111) texture in order to achieve the desired exchange biasing effect. However, in order to produce the desired (111) texture in the antiferromagnetic layer 56, conventional multilayer structures require an intial deposition of the seed layer 54 having a similar (111) texture. For example, when the multilayer structure 50 is used in a spin valve sensor, the ferromagnetic layer 58 may comprise Co or FeCo and the antiferromagnetic layer 56 may comprise $Ir_{20}Mn_{80}$. However, in order to achieve the exchange coupling effect, an additional (111) texture ferromagnetic film such as $Ni_{80}Fe_{20}$ is required as a seed layer below the deposited $Ir_{20}Mn_{80}$ film in order to produce the effect.

Figure 4:
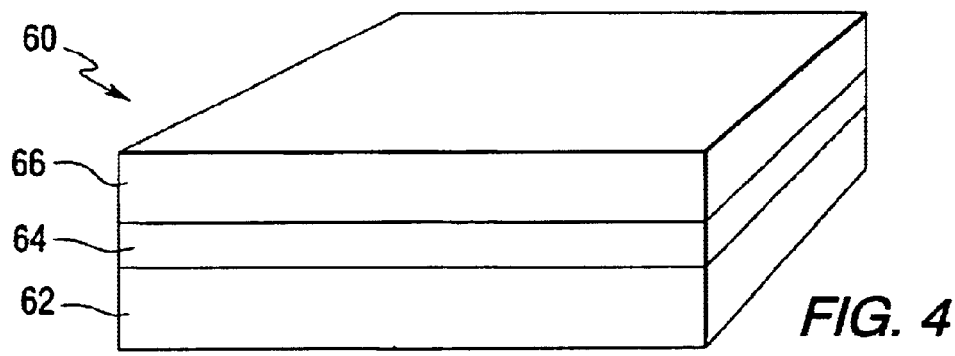
FIG. 4 is a partially schematic side sectional perspective view of a laminated structure including a substrate, an antiferromagnetic IrMnN film and a ferromagnetic film in accordance with an embodiment of the present invention.

FIG. 4 schematically illustrates a multilayer structure 60 in accordance with an embodiment of the present invention. The multilayer structure 60 includes a substrate 62, an antiferromagnetic IrMnN film 64 and a ferromagnetic film 66. Depending upon the particular application, the substrate 62 may be made of any desired material such as Si, quartz, glass, glass ceramic, AlTiC or the like.

The ferromagnetic layer 66 of the multilayer structure 60 shown in FIG. 4 may comprise any suitable material such as Fe, Co, Ni, FeCo, NiFe, NiCo, CoNiFe, FeCoB, FeAlN, and the like. For spin valve sensors, the ferromagnetic layer 66 typically comprises NiFe or FeCo alloy. For perpendicular recording media soft underlayers, the ferrromagnetic layer 66 typically comprises FeCoB, NiFe or CoNiFe. The thickness of the ferromagnetic layer 66 may be selected depending upon the particular application, and typically ranges from about 5 to about 20 nanometers. Although the multilayer structure 60 shown in FIG. 4 includes a single ferromagnetic layer 66, multiple ferromagnetic layers may alternatively be used. For example, several alternating layers of ferromagnetic films may be separated by antiferromagnetic IrMnN films of the present invention.

The antiferromagnetic film IrMnN film 64 shown in FIG. 4 may comprise from about 2 to about 78 atomic percent Ir, from about 16 to about 96 atomic percent Mn, and from about 1 to about 20 atomic percent N. Typically, the IrMnN antiferromagnetic film 64 comprises from about 5 to about 14 to about 23 atomic percent Ir, from about 69 to about 83 atomic percent Mn, and from about 2 to about 10 atomic percent N. In addition to Ir, Mn and N, the film 64 may optionally include other additives and dopants, such as Ni, Cu, Ta, Hf, Pd, Ti, Nb, Cr, Si, Al, W, Zr, Ga, Be, In, Sn, V, Mo, Re, Co, Ru, Rh, Pt, Ge, Os, Ag, Cd, Zn and Au in amounts up to about 30 atomic percent.

The thickness of the antiferromagnetic IrMnN film 64 may be selected based upon the particular application. For example, for soft underlayer applications, the film 64 may have a thickness of from about 5 to about 20 nanometers, typically from about 5 to about 10 nanometers. For many applications, the ratio of the thickness of the antiferromagnetic IrMnN film 64 to the ferromagnetic film 66 may range from about 1:1 to about 1:4, typically from about 1:1 to about 1:2.

FIGS. 5a and 5b illustrate planar orientations in a cubic crystalline unit cell. FIG. 5a shows the (111) plane, while FIG. 5b shows the (200) plane. In accordance with the present invention, the IrMnN film has a (200) texture. The (200) texture indicates that the film grows with its crystals predominantly square with the film surface, i.e. the cube faces are either parallel or orthogonal to the film surface. In contrast, a (111) texture indicates a tilted cubic structure relative to the film surface.

FIG. 6 illustrates a laminated structure 70 including multiple alternating layers of antiferromagnetic IrMnN films 64 and ferromagnetic films 66. Although three (3) antiferromagnetic IrMnN films 64 and three (3) ferromagnetic films 66 are shown in FIG. 6, any suitable number of layers may be used. For example, the multilayer structure may include from one (1) to forty (40) layers of each of the IrMnN films and ferromagnetic films. Each IrMnN film 64 may comprise the same composition and thickness. Alternatively, different IrMnN compositions and/or thicknesses may be used. Similarly, the compositions and thicknesses of the ferromagnetic films may be the same or different. Multilayer films such as the laminated structure 70 shown in FIG. 6 may be used in applications such as magnetic recording media.

FIG. 7 illustrates a perpendicular magnetic recording medium 80 which may include an antiferromagnetic IrMnN film in accordance with another embodiment of the present invention. The perpendicular magnetic recording medium 80 comprises a substrate 38, a soft magnetic underlayer 40, a hard magnetic recording layer 44, and a protective overcoat 46, similar to the layers shown in FIG. 2 and previously described. In this embodiment, the soft magnetic underlayer 40 comprises a ferromagnetic film 66 deposited on an antiferromagnetic IrMnN film of the present invention. Although a single antiferromagnetic IrMnN film 64 and a single ferromagnetic film 66 are shown in FIG. 7, the soft magnetic underlayer 40 may alternatively include multiple antiferromagnetic and ferromagnetic layers, as described in association with FIG. 6.

The antiferromagnetic IrMnN films of the present invention may be made by a reactive sputtering technique. For example, the antiferromagnetic IrMnN films may be made by reactive sputtering Ir and Mn in a reactive nitrogen-containing atmosphere. The Ir and Mn may be provided as individual elements, or as an alloy such as $Ir_{20}Mn_{80}$. Typically, the reactive nitrogen-containing atmosphere includes an inert gas such as argon or the like. For example, the atmosphere may comprise from about 1 to about 50 volume percent nitrogen and from about 50 to about 99 volume percent inert gas. In one embodiment, the atmosphere comprises from about 2 to about 20 volume percent nitrogen and from about 80 to about 98 volume percent inert gas. As a particular example, the reactive sputtering operation may be carried out in an atmosphere comprising 5 volume percent nitrogen and 95 volume percent argon. The reactive sputtering process is typically carried out at room temperature.

Figure 8:
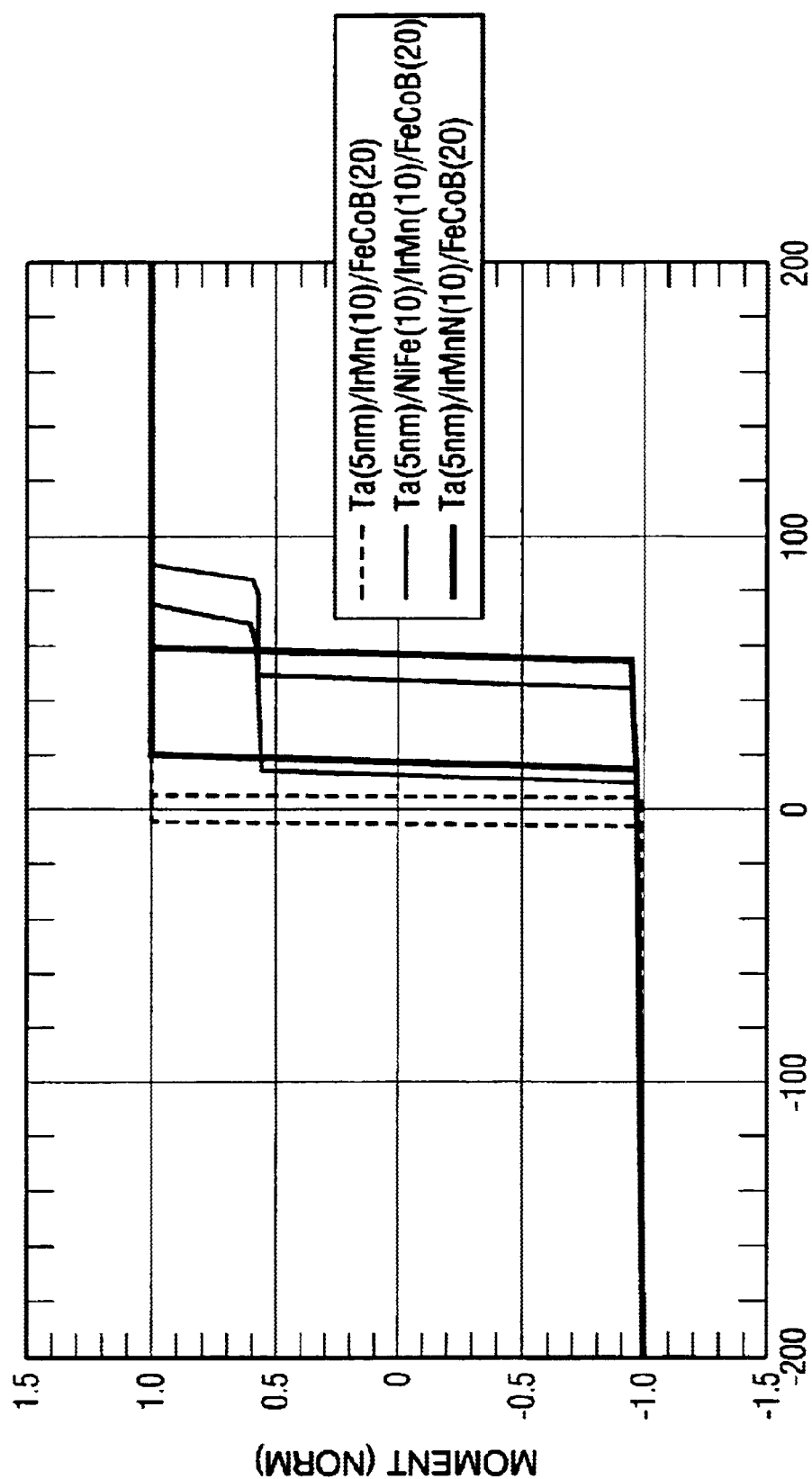
FIG. 8 is a graph of magnetic field versus moment, illustrating the exchange bias effect achieved with a multilayer structure including an antiferromagnetic IrMnN film of the present invention in comparison with other multilayer strictures.

FIG. 8 demonstrates the exchange bias effect in a multilayer structure using IrMnN as an antiferromagnetic layer, in comparison with a similar multilayer structure comprising an IrMn layer, and another multilayer structure comprising an IrMn layer deposited on a NiFe buffer layer. In FIG. 8, the designation "Ta(5 nm)/IrMn(10)/FeCoB(20)" means a multilayer structure comprising a 5 nanometer Ta base layer, a 10 nanometer $Ir_{20}Mn_{80}$ layer, and a 20 nanometer $Fe_{58.5}Co_{31.5}B_{10}$ layer. The designation "Ta(5 nm)/NiFe(10)/IrMn(10)/FeCoB(20)" corresponds to a similar multilayer structure, with the addition of a 10 nanometer $Ni_{80}Fe_{20}$ layer between the Ta and IrMn layers. The designation "Ta(5 nm)/IrMnN(10)/FeCoB(20)" indicates a multilayer structure in accordance with an embodiment of the present invention, with a 10 nanometer IrMnN layer between the Ta and FeCoB layers. The IrMnN layer was made by reactive sputtering $Ir_{20}Mn_{80}$ in an atmosphere comprising 5 volume percent $N_2$ and 95 volume percent Ar. The Ta seed layer and the FeCoB ferromagnetic layer were deposited by dc sputtering in an Ar atmosphere. The thick solid curve shown in FIG. 8 illustrates a significantly increased exchange biasing effect achieved with the IrMnN structure. The dashed curve represents no exchange bias effect using pure IrMn. The thin solid curve represents results typical of prior systems that require a (111) NiFe layer to produce the exchange coupling effect.

Figure 9:
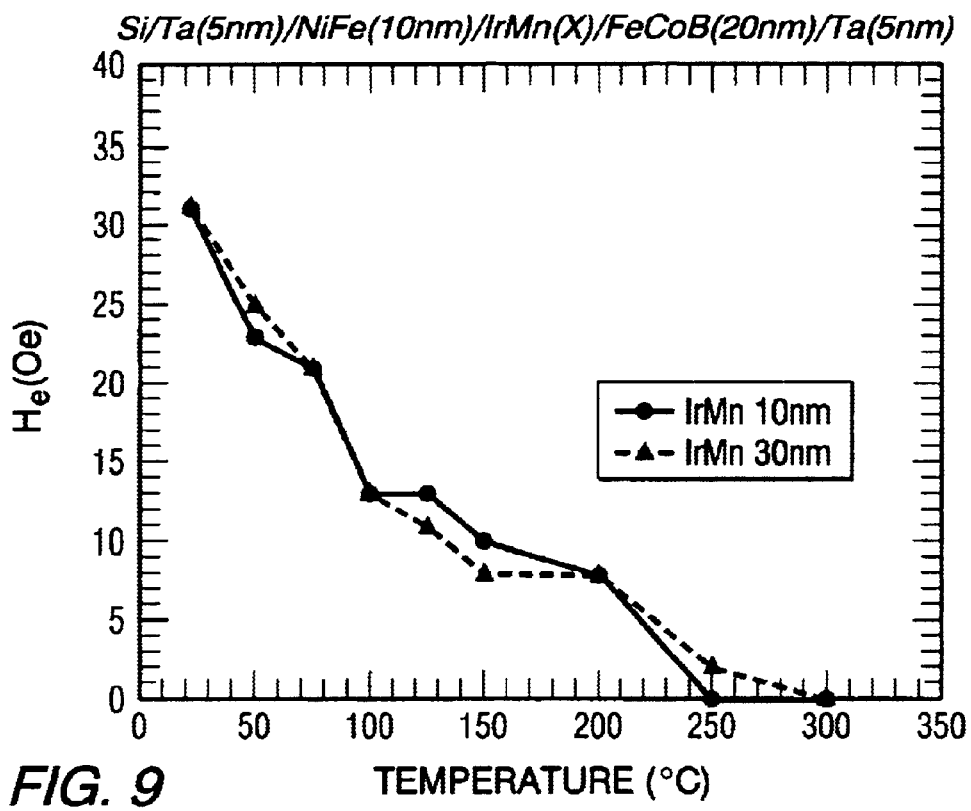
FIG. 9 is a graph of temperature versus exchange field for multilayer structures including IrMn antiferromagnetic and seed layer films, demonstrating relatively low blocking temperatures for such films.
Figure 10:
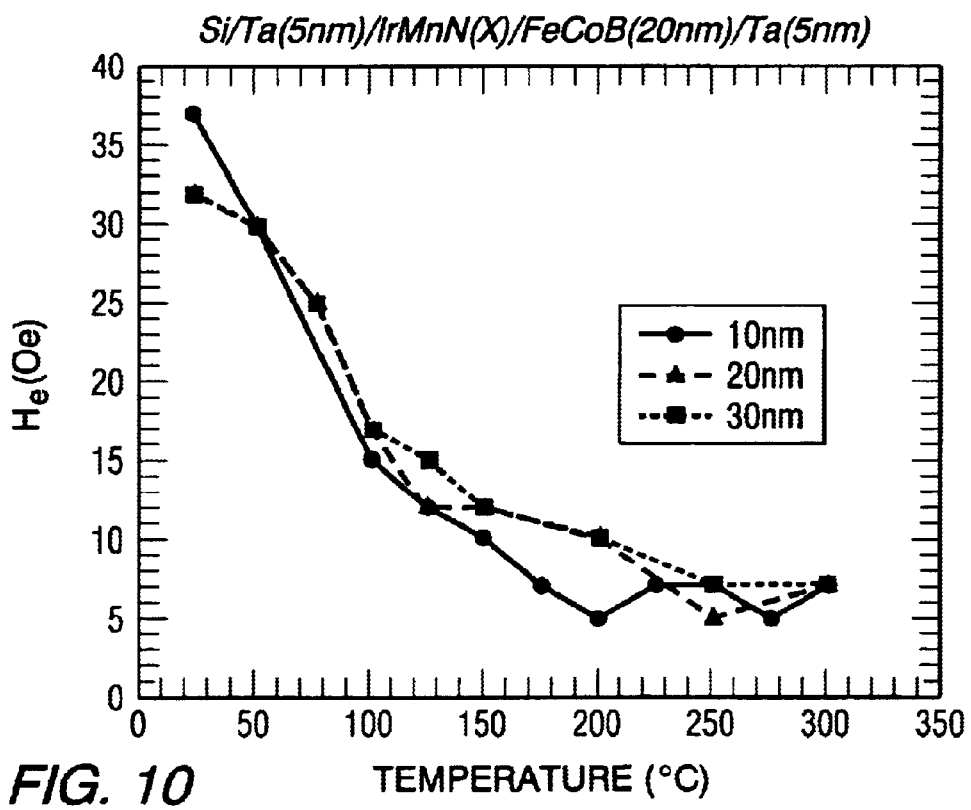
FIG. 10 is a graph of temperature versus exchange field for multilayer structures of the present invention including IrMnN antiferromagnetic films, demonstrating increased blocking temperatures in comparison with the samples illustrated in FIG. 8.

FIG. 9 and FIG. 10 compare the value of the exchange field $H_e$ (offset of hysteresis loop from zero field) for the IrMnN structure versus the IrMn structure, respectively. As shown in FIG. 9, the blocking temperature at which $H_e$ goes to zero is greater than 300° C. for the IrMnN structures. The blocking temperature is 250° C. or less for the IrMn structures.

Whereas particular embodiments of this invention have been described above for purposes of illustration, it will be evident to those skilled in the art that numerous variations of the details of the present invention may be made without departing from the invention as defined in the appended claims.

What is claimed is:

1. A film directly deposited on a non-seed layer substrate consisting essentially of IrMnN having a (200) texture.

2. The film of claim 1, wherein the IrMnN comprises from about 2 to about 78 atomic percent Ir, and from about 16 to about 96 atomic percent Mn.

3. The film of claim 1, wherein the IrMnN comprises from about 14 to about 23 atomic percent Ir, and from about 69 to about 83 atomic percent Mn.

4. The film of claim 1, wherein the IrMnN comprises from about 1 to about 20 atomic percent N.

5. The film of claim 1, wherein the IrMnN comprises from about 2 to about 10 atomic percent N.

6. The film of claim 1, wherein the film has thickness of from about 5 to about 20 nm.

7. The film of claim 1, wherein the film is an exchange biasing layer.

8. The film of claim 1, wherein the film is a seed layer.

9. A layered magnetic structure comprising:
a non-seed layer substrate;
a layer consisting essentially of IrMnN having a (200) texture directly deposited on the substrate; and
a ferromagnetic layer deposited on the IrMnN layer, wherein the structure has a blocking temperature of greater than 300° C.

10. The layered magnetic structure of claim 9, wherein the IrMnN comprises from about 2 to about 78 atomic percent Ir, and from about 16 to about 96 atomic percent Mn.

11. The layered magnetic structure of claim 9, wherein the IrMnN comprises from about 1 to about 20 atomic percent N.

12. The layered magnetic structure of claim 9, wherein the film has thickness of from about 5 to about 20 nm.

13. The layered magnetic structure of claim 9, wherein the structure comprises a plurality of the IrMnN layers.

14. The layered magnetic structure of claim 9, wherein the structure comprises a plurality of the ferromagnetic layers.

15. The layered magnetic structure of claim 9, wherein the structure comprises from 2 to 40 of the IrMnN layers, and from 2 to 40 of the ferromagnetic layers.

16. The layered magnetic structure of claim 9, wherein the IrMnN layer is a seed layer for the ferromagnetic layer.

17. The layered magnetic structure of claim 9, wherein the IrMnN and ferromagnetic layers are exchange coupled.

18. A soft magnetic underlayer of a perpendicular magnetic recording media comprising the layered magnetic structure of claim 9.

19. A spin valve sensor including a pinning layer comprising the layered magnetic structure of claim 9.

20. A method of making a layered magnetic structure comprising:
directly depositing a layer consisting essentially of IrMnN having a (200) texture on a non-seed layer substrate; and
depositing a ferromagnetic layer on the IrMnN layer, wherein the structure has a blocking temperature of greater than 300° C.

21. The method of claim 20, wherein the IrMnN layer is a seed layer for the ferromagnetic layer.

22. The method of claim 20, wherein the IrMnN and ferromagnetic layers are exchange coupled.

* * * * *

UNITED STATES PATENT AND TRADEMARK OFFICE
CERTIFICATE OF CORRECTION

PATENT NO. : 6,740,398 B2
DATED : May 25, 2004
INVENTOR(S) : Christopher Loren Platt It is certified that error appears in the above-identified patent and that said Letters Patent is hereby corrected as shown below:

<u>Title page,</u>
Item [74], *Attorney, Agent, or Firm,* "Allen" should read -- Alan --.

<u>Column 5,</u>
Line 18, "couping" should read -- coupling --.
Line 58, before "14" delete "to".

Signed and Sealed this

Eighteenth Day of April, 2006

JON W. DUDAS
*Director of the United States Patent and Trademark Office*